United States Patent [19]

Wuu et al.

[11] Patent Number: 5,707,895
[45] Date of Patent: Jan. 13, 1998

[54] THIN FILM TRANSISTOR PERFORMANCE ENHANCEMENT BY WATER PLASMA TREATMENT

[75] Inventors: Shou-Gwo Wuu, Hsinchu County; Cheng-Yeh Shih, Hsinchu; Kan-Yuan Lee, Tainan, all of Taiwan

[73] Assignee: Taiwan Semiconductor Manufacturing Company, Ltd., Hsin-chu, Taiwan

[21] Appl. No.: 734,559

[22] Filed: Oct. 21, 1996

[51] Int. Cl.$^6$ .................................. H01L 21/265
[52] U.S. Cl. .................. 438/158; 438/308; 438/910
[58] Field of Search ................ 437/40, 41, 901, 437/937; 438/158, 308, 910

[56] References Cited

U.S. PATENT DOCUMENTS

| | | | |
|---|---|---|---|
| 4,879,156 | 11/1989 | Herron et al. | 428/137 |
| 5,273,920 | 12/1993 | Kwasnick et al. | 437/101 |
| 5,384,271 | 1/1995 | Kwasnick et al. | 437/40 |
| 5,419,804 | 5/1995 | Ojha et al. | 156/643.1 |
| 5,470,619 | 11/1995 | Ahn et al. | 427/578 |
| 5,477,073 | 12/1995 | Wakai et al. | 257/347 |
| 5,508,227 | 4/1996 | Chan et al. | 437/40 |
| 5,534,445 | 7/1996 | Tran et al. | 437/40 |
| 5,567,633 | 10/1996 | Gosain et al. | 437/40 |

FOREIGN PATENT DOCUMENTS

| | | | |
|---|---|---|---|
| 63-9156 | 1/1988 | Japan | 437/937 |
| 2-310932 | 12/1990 | Japan | 437/937 |

OTHER PUBLICATIONS

Szeto et al, "Correlation of chemical and electrical properties of plasma-deposited tetramethyisilane films", Journal of Applied Physics, vol. 52, pp. 903-909, 1981.

Wolf et al, "Silicon Processing For The VLSI Era, vol. 1, Process Technology", Lattice Press, pp.185-191, 1986.

Takashi et al, "High Performance Poly-Si TFT's With ECR-Plasma Hydrogen Passivation", IEEE Transactions on Electron Devices, vol. 36, No. 3, pp. 529-533, Mar. 1989.

Sano et al, "High Quality $SiO_2$/Si Interfaces of Poly-Crystalline Silicon Thin Film Transistors by Annealing in Wet Atmosphere", IEEE Electron Device Letters, vol. 16, No. 5, May, 1995, pp. 157-160.

Chern et al. "The Effects of $H_2$-$O_2$ Plasma Treatment on the Characteristics of Polysilicon Thin-Film Transistors", IEEE Trans. Electron, Dev. vol. 40, No. 12, Dec. 1993, pp. 2301-2306.

*Primary Examiner*—John Niebling
*Assistant Examiner*—Michael S. Lebentritt
*Attorney, Agent, or Firm*—George O. Saile; Stephen B. Ackerman

[57] ABSTRACT

A process is provided in which silicon thin film transistors fabricated with polycrystalline silicon, silicon oxide, and silicon conductive layers are exposed to microwave plasmas containing water vapor and to subsequent annealing steps to bring about an improvement in the ratio of device drain current in the conductive state to that in the non-conductive state, and a lower device subthreshold voltage swing.

17 Claims, 3 Drawing Sheets

I. PLASMA PASSIVATION
   Temperature 200-240 °C
   Power 1200-1600 watts
   H2O vapor Flow rate
      400-600 sccm
   Time 10-30 sec
   Pressure 1.5-2.5 Torr II. PLASMA STRIPPING
   Temperature 200-240 °C
   Power 1200-1600 watts
   Gas Mixture flow rates
      H2O 200-400 sccm
      O2 3000-4000 sccm
      N2 150-250 sccm
   Pressure 1.5-2.5 Torr
   Time 150-210 min III. ANNEALING
   Temperature 225-275 °C
   Time 15-40 min

*FIG. 4*

THIN FILM TRANSISTOR PERFORMANCE ENHANCEMENT BY WATER PLASMA TREATMENT

BACKGROUND OF THE INVENTION

1. Field of the Invention

This invention relates to a silicon thin film transistor with improved electrical performance characteristics obtained by exposure to an electrical plasma. More particularly, it relates to a polycrystalline silicon-gate thin film transistor formed on an insulating substrate whose threshold voltage and drain current characteristics are improved after exposure to an electrical plasma sustained in a wet (water-containing) ambient environment.

2. Description of the Prior Art

Conventional field-effect transistors such as the metal-oxide-silicon (MOSFET) or the junction (JFET) versions of the device are fabricated in single crystal silicon for reasons relating to certain desired device performance characteristics such as high-frequency response, for example. For some purposes, the cost of such single-crystal devices is prohibitively high where high-frequency behavior is not required. In other cases, the inherent leakage current between devices fabricated in the single crystal body of silicon is undesirable, or the inherent capacitance results in excessive noise coupling. For these and other reasons, the polycrystalline silicon-gate thin-film transistor has become increasingly used as a relatively low-cost, low leakage-current switching device, especially in arrays or in conjunction with other types of devices or sensors located on insulating substrates. A typical example of an application where the TFT properties are especially useful is in the fabrication of static random-access memory (SRAM) arrays where they permit three-dimensional circuit designs which greatly reduce the size of a SRAM memory cell and hence afford much greater circuit density per unit area.

The process for fabricating silicon TFT devices employs polycrystalline silicon deposited on an insulating substrate such as glass to act as a gate electrode which is covered by a thin layer of an insulator such as silicon oxide. A layer of conductive silicon deposited on the silicon oxide layer surface is formed into the conductive channel of the device by suitable fabrication steps, which serve to delineate the channel and to form the source and drain regions along with the required electrical contacts to the gate, source, and drain regions. The advantages of such TFT devices in applications where they are used, such as switches for modulating signals to storage, sensor, and detector devices in arrays, lie in their ease of fabrication and compatibility with the other devices, their inherent isolation and low leakage currents between devices, and the ability to control easily device characteristics such as impedance, transconductance, and threshold or "turn-on" voltage.

As in conventional single-crystal silicon MOS devices, it is technologically less difficult to fabricate devices which operate by electrical conduction due to "holes" to carry the current in the silicon. Such devices are known as p-channel devices due to the analogy with the designation of silicon or other elemental semiconductors which have an excess of "holes" or missing electrons in the valence band of allowed electron energies as p-type semiconductors. Thus the polycrystalline silicon-gate TFT becomes conductive and allows source-drain current to flow when the gate voltage is negative to attract p-type "hole" positively charged carriers to the channel region. Thus it is sometimes referred to as a PMOS-type device despite the slight ambiguity involved in the implication of a metal as opposed to a silicon gate device.

Of particular importance in using TFT device arrays is the leakage current in the device non-conducting or "off" state. This parameter, known as Ioff, is generally to be kept as low as attainable, and the ratio of the device current Ion in its conducting or "on" state is a measure of device quality: i.e. the higher the Ion/Ioff ratio, the better the device quality. Another parameter of importance is the device subthreshold voltage swing, which is the voltage which must be applied to the gate electrode to allow an electrical current to flow between the source and drain electrodes; i. e. it is the gate electrode voltage which must be applied to increase the drain current flowing in the device channel by one order of magnitude. The TFT device operates in the sub-threshold region, and this voltage is the previously-described threshold voltage Vt. It is desirable that Vt be relatively small so that the negative gate voltage required to turn on the device be low.

There has been considerable effort devoted to investigation of fabrication processes and conditions and their effects on these and other device characteristics. It has been reported by Chern et al in the IEEE Trans. Electron Dev., Vol. 40, No. 12, Dec. 1993, p. 2301, that exposure of TFT devices to radiofrequency electrical plasmas in O2 and H2 has effects on the characteristics of the devices. Other work by Sano et al published in the IEEE Electron Device Letters Vol. 16, No. 5, May 1995, p. 157, claims that annealing of TFT devices in a wet ambient atmosphere improves the quality of the silicon-silicon oxide interface. However, no mention is made of any study of the effects of exposure of TFT devices to water-containing (wet atmosphere) plasmas or annealing thereafter. Investigations of methods for producing polycrystalline silicon films by annealing of amorphous deposited silicon layers are described by Ahn et al in U.S. Pat. No. 5,470,619 but the effects of such silicon treatments on subsequent TFT device properties is not discussed. The use of plasma etching techniques in the fabrication of thin film laser devices using layers of compound semiconductor materials such as indium phosphide (InP) etc. is covered by Ojha et al in U.S. Pat. No. 5,419,804, but neither silicon or TFT devices are mentioned. Finally, the reduction of Ioff leakage in silicon TFT devices by exposure to complex chemical processing in addition to dry reactive ion etching, the final chemical treatment being exposure of the device to wet photoresist stripping agent, is discussed by Kwasnick et al in U.S. Pat. No. 5,384,271. There is, however, no mention of methods for device parameter improvements using methods such as electrical plasmas which do not bring wet chemicals into contact with the device or cause removal of material by etching.

SUMMARY OF THE INVENTION

It is a principal object of the invention to provide a process for increasing the ratio of the device current in the conducting state to that of the non-conducting state, and to lower the device sub-threshold voltage swing, of thin-film transistor devices by exposure to electrical plasma and annealing treatments. Another object of the invention is to describe a process for fabrication of polycrystalline silicon thin-film transistor devices whose critical device electrical parameters are optimized by the post-fabrication process steps.

In accordance with the objects of the invention, a process is provided in which silicon thin film transistors fabricated with polycrystalline silicon, silicon oxide, and doped silicon layers are exposed to a microwave electrical plasma containing water vapor, and to subsequent annealing steps to bring about an improved higher ratio of device current in the conductive state to that in the non-conductive state, and a lower device sub-threshold voltage swing. These objects are achieved by a method for the fabrication of silicon-gate thin film field effect transistor comprising the sequential deposition of a silicon gate layer, a silicon oxide gate insulation layer, and a silicon conductive layer on an insulating substrate, formation of higher-conductivity source and drain electrode regions in the conductive silicon layer by ion implantation methods, passivation of these layers by covering them with a glass passivation layer, etching of contact holes through the passivation layer, deposition of a conductive metal layer and formation of a pattern of gate, source, and drain electrodes and interconnections, exposure to electrical plasmas, and annealing.

BRIEF DESCRIPTION OF THE DRAWINGS

In the accompanying drawings forming a material part of this description, there is shown:

FIG. 4 is a flow chart of the device performance enhancement process of the invention.

DESCRIPTION OF THE PREFERRED EMBODIMENT

Figure 1:
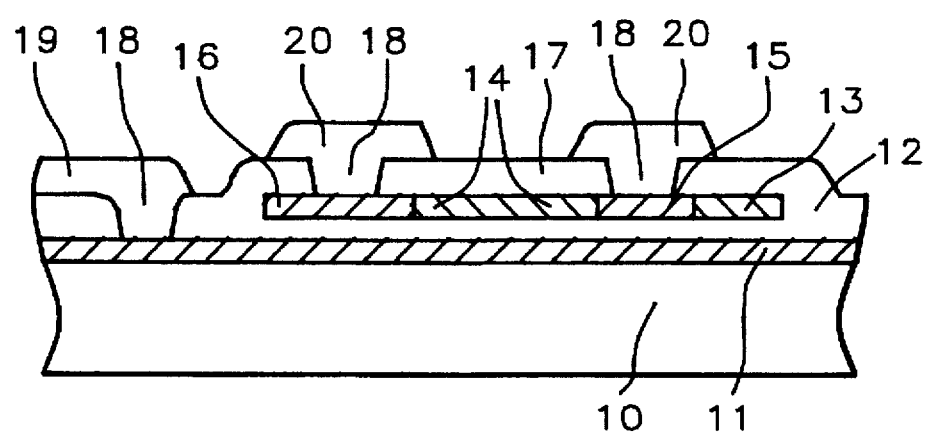
FIG. 1 is a schematic cross-sectional diagram of a silicon gate thin film transistor processed according to the invention.

Referring now to FIG. 1, there is shown a polycrystalline silicon gate thin film transistor (TFT) fabricated and optimized by the process of the invention. On an insulator substrate 10 is deposited a polycrystalline silicon gate layer 11 about 500 to 600 A thick which is covered by a silicon oxide gate insulation layer 12 about 200 to 400 A thick. An amorphous silicon layer 13 about 200 to 400 A thick is deposited over the gate insulation to serve as the conductive channel after annealing at about 500° to 700° C. for between about 10 to 24 hours to recrystallize the amorphous silicon and increase its conductivity. The actual channel length 14 is defined by ion implantation using suitable masking methods to form the source and drain regions 15 and 16. After deposition of a glass passivation layer 17, contact holes 18 are opened, and a metallization layer is deposited and formed into an appropriate gate electrode contact 19, source and drain contacts 20, and interconnections to other devices.

Referring now more particularly to FIG. 4, there is shown a flow chart of the device fabrication process and including the final step of optimizing the device electrical characteristics by exposure to an electrical plasma. The plasma exposure process may be carried out in conventional plasma exposure systems such as the P5000. The device wafers are loaded into the system and the first step is to passivate the devices by exposing them to a microwave plasma maintained in a water vapor ambient atmosphere (H2O) at a total pressure of about 1.5 to 2.5 Torr at a flow rate of about 400 to 600 standard cubic centimeters per second by a microwave (2.45 Ghz) power input of about 1200 to 1600 watts. The device wafers are held on a plate whose temperature is maintained at between 200° and 240° C. The second step is to strip the devices by exposing them to an electrical plasma sustained in a mixture of oxygen, nitrogen, and water vapor (N2/O2/H2O) gases flowing at about 200 to 400, 3000 to 4000, and 150 to 250 standard cubic centimeters per second respectively for about 150 to 210 minutes at a microwave power input of about 1200 to 1600 watts (2.45 GHz) and a total gas pressure of about 1.5 to 2.5 Torr. The final step is an annealing of the device at about 225° to 275° C. in a nitrogen (N2) gas ambient atmosphere for about 20 to 40 minutes. After completion of the three-step process, the TFT devices are electrically tested.

Figure 2:
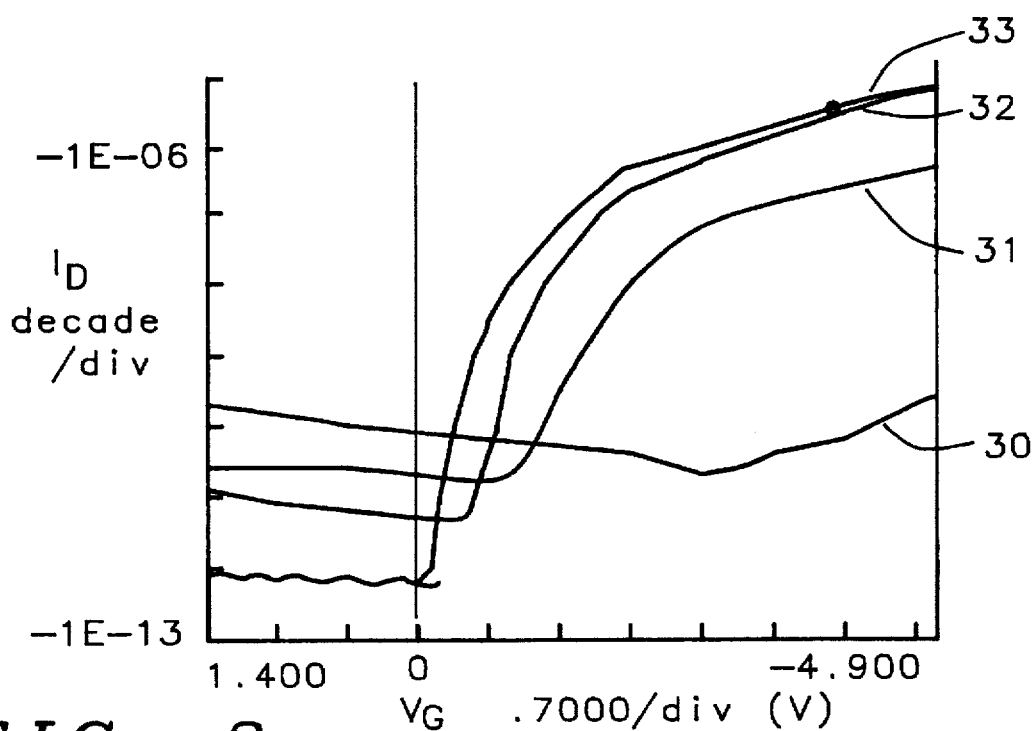
FIG. 2 is a diagram of the device drain current-gate voltage characteristic curves for various plasma exposure times.

In FIG. 2, the drain current of the device is shown as a function of gate voltage from positive values where the device is in a non-conducting state (turned "Off") to negative values where the device is placed in a conductive ("on") state. The curves shown are for the unexposed device 30, after 6 minutes of exposure 31, after 1 hour of exposure 32, and after 1 hour of exposure plus annealing for 30 minutes at 250° C. in an atmosphere of N2 33. It is readily apparent from the curves of FIG. 2 that the device drain current in the linear region of a given low gate voltage steadily increases with increasing plasma exposure, and the subthreshold swing decreases in the same fashion. Hence both desirable results are achieved by the same plasma exposure and annealing process.

Figure 3:
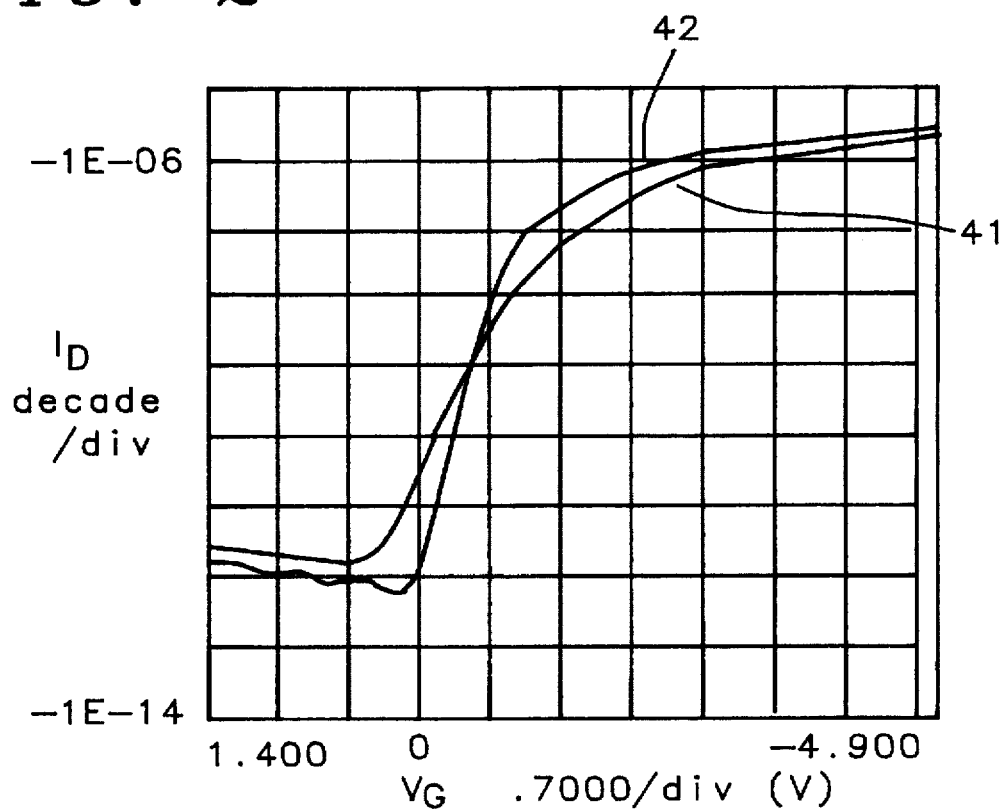
FIG. 3 is a diagram of the device drain current-gate voltage characteristic curves after exposure to water-containing plasma or H2 plasma.

In FIG. 3, the device drain current-gate voltage characteristic curves are shown for exposure to electrical plasmas sustained in H2 gas 41 and in H2O vapor 42. Devices exposed to H2O plasma exhibit higher Ion/Ioff ratios and lower subthreshold voltage swings than those exposed to H2 plasma, being 130 millivolts/decade for the former and 200 millivolts/decade for the latter. The superiority of the former is evident. In addition to the differences in the gaseous environments, the plasmas employed in these exposures differ in their methods of generation in that the plasma sustained in H2O is done by means of microwave power at 2.45 GHz, while the plasma sustained in H2 is achieved by means of radiofrequency power at 13.56 MHz.

The detailed mechanisms of the physical, chemical, and electrical processes by which plasmas modify the electrical characteristics of TFT devices are not fully understood. It has been well-known that effects due to ion bombardment leading to space charges in insulators adjacent to silicon can be either beneficial or detrimental depending on the details of the processes and structures involved. Likewise, the effects of hydrogen molecules and particularly atoms on the properties of both bipolar and MOS transistors have been studied since the beginning of the development of transistor and integrated circuit technology. The lack of complete knowledge of the detailed mechanisms involved has not hindered the useful nature of the empirically-established methods of device fabrication and optimization.

While the invention has been particularly shown and described with reference to the preferred embodiment thereof, it will be understood by those skilled in the art that various changes in form and details may be made without departing from the spirit of the invention.

What is claimed is:

1. A method for the fabrication of silicon-gate thin film field effect transistors with optimized device electrical parameters comprising:

depositing a polycrystalline silicon gate layer on an insulating substrate;

depositing a silicon oxide gate insulation layer on the silicon gate layer;

depositing a silicon conductive layer on the gate insulation layer;

forming of higher-conductivity regions by ion implantation into the conductive silicon layer to form the source and drain regions which define the device channel dimensions;

passivating already-deposited layers by covering them with a glass passivation layer;

etching of electrical contact holes through the glass passivation layer;

depositing and defining a pattern of conductive metal layer to form gate, source, and drain electrical contacts and interconnections;

exposing devices to electrical plasmas in a water vapor gaseous environment; and annealing.

2. The method of claim 1 wherein said polycrystalline silicon gate layer is between about 500 and 600 A thick.

3. The method of claim 1 wherein said silicon oxide gate insulation layer is between about 200 to 400 A thick.

4. The method of claim 1 wherein said amorphous silicon conductive layer is between about 200 to 400 A thick.

5. The method of claim 1 wherein said glass passivation layer comprises a boro-phospho-silicate glass containing boron, phosphorus, and silicon.

6. The method of claim 4 wherein said silicon layer is rendered more conductive by annealing at between about 500° to 700° C. for between about 10 to 24 hours.

7. The method of claim 1 wherein said exposing devices to electrical plasma comprises a first passivation step and a second stripping step.

8. The method of claim 7 wherein said first passivation step exposes said devices to a plasma process comprising:

maintaining devices in a reactor chamber at a holder temperature of between about 200° to 240° C.;

sustaining an electrical plasma therein in said water vapor gaseous environment at a pressure of between about 1.5 and 2.5 Torr and a gas flow rate of between about 400 to 600 standard cubic centimeters per second;

supplying microwave power to sustain said plasma at between about 1200 to 1600 watts at a frequency of 2.45 GEv; and exposing devices to said plasma for between about 10 to 30 seconds.

9. The method of claim 7 wherein said second stripping step exposes devices to plasma process comprising:

maintaining said devices in a reactor chamber at a holder temperature of between about 200° to 240° C.;

sustaining an electrical plasma therein in a gas mixture comprising water vapor, oxygen, and nitrogen at gas flow rates of about 200 to 400, 3000 to 4000, and 150 to 250 standard cubic centimeters per second respectively at a total gas pressure of about 1.5 to 2.5 Torr;

supplying microwave power to sustain said electrical plasma at between about 1200 to 1600 watts at a frequency of 2.45 GHz; and exposing devices to said plasma for between about 150 to 210 minutes.

10. The method of claim 1 wherein said anneal step is carried out in an environment of nitrogen gas for between about 20 to 40 minutes at a temperature of between about 225° to 275° C.

11. A process for improving the electrical parameters of silicon-gate thin film transistor devices comprising:

fabricating said devices on an insulating substrate by successive deposition of silicon gate, silicon oxide gate insulation, and conductive silicon layers, annealing at between about 500° to 700° C. for between about 10 to 24 hours;

ion implanting, passivating, contact hole opening, and forming a metal pattern to produce complete devices;

exposing said devices to a first plasma passivation step in a water vapor environment, wherein said first plasma passivation step exposes said devices to a plasma process comprising:

maintaining said devices in a reactor chamber at a device holder temperature of between about 200° to 240° C.;

sustaining an electrical plasma therein in said water vapor environment comprising water vapor at a gas flow rate of between about 400 to 600 standard cubic centimeters per second and a total gas pressure of about 1.5 to 2.5 Torr;

supplying microwave power at between about 1200 to 1600 watts to the reactor at a frequency of 2.45 GHz to sustain the plasma; and exposing said devices to said plasma for about 10 to 30 seconds;

exposing said devices to a second plasma stripping step in a water vapor environment; and annealing of said devices.

12. The process of claim 11 wherein said silicon gate layer is between about 500 to 600 A thick, said silicon oxide gate insulation layer is between about 200 to 400 A thick, and said conductive silicon layer is between about 200 to 400 A thick.

13. The process of claim 11 wherein said conductive layer is annealed after deposition at between about 500° to 700° C. for between about 10 to 24 hours to increase conductivity.

14. The process of claim 11 wherein said second plasma exposes said devices to a plasma process comprising;

maintaining said devices in a reactor chamber at a device holder stripping step temperature of between about 200° to 240° C.;

sustaining an electrical plasma therein in a gas mixture comprising water vapor, oxygen, and nitrogen at gas flow rates of between about 200 to 400, 3000 to 4000, and 150 to 250 standard cubic centimeters per second respectively at a total gas pressure of about 2.0 Torr;

supplying microwave power to said reactor at between about 1200 to 1600 watts at a frequency of 2.45 GHz to sustain said plasma; and exposing said devices to said plasma for between about 150 to 210 minutes.

15. The process of claim 11 wherein said annealing of said devices is carded out in an atmosphere of nitrogen gas for between about 15 to 40 minutes at a temperature of between about 225° to 275° C.

16. A method for the fabrication of silicon-gate thin film field effect transistors with optimized device electrical parameters comprising:

depositing a polycrystalline silicon gate layer on an insulating substrate;

depositing a silicon oxide gate insulation layer on the silicon gate layer;

depositing a silicon conductive layer on the gate insulation layer;

forming of higher-conductivity regions by ion implantation into the conductive silicon layer to form the source and drain regions which define the device channel dimensions;

passivating already-deposited layers by covering them with a glass passivation layer;

etching of electrical contact holes through the glass passivation layer;

depositing and defining a pattern of conductive metal layer to form gate, source, and drain electrical contacts and interconnections;

exposing devices to electrical plasmas, comprising a first passivation step and a second stripping step, wherein the first passivation step comprises:

maintaining devices in a reactor chamber at a holder temperature of between about 200° to 240° C.;

sustaining an electrical plasma therein in a water vapor gaseous environment at a pressure of between about 1.5 and 2.5 Torr and a gas flow rate of between about 400 to 600 standard cubic centimeters per second;

supplying microwave power to sustain said plasma at between about 1200 to 1600 watts at a frequency of 2.45 GEv; and exposing devices to said plasma for between about 10 to 30 seconds; and annealing.

17. The method of claim 16 wherein said second stripping step exposes devices to plasma process comprising:

maintaining said devices in a reactor chamber at a holder temperature of between about 200° to 240° C.;

sustaining an electrical plasma therein in a gas mixture comprising water vapor, oxygen, and nitrogen at gas flow rates of about 200 to 400, 3000 to 4000, and 150 to 250 standard cubic centimeters per second respectively at a total gas pressure of about 1.5 to 2.5 Torr;

supplying microwave power to sustain said electrical plasma at between about 1200 to 1600 watts at a frequency of 2.45 GHz; and exposing devices to said plasma for between about 150 to 210 minutes.

* * * * *